(12) United States Patent
Park et al.

(10) Patent No.: US 8,581,394 B2
(45) Date of Patent: Nov. 12, 2013

(54) SEMICONDUCTOR PACKAGE MODULE AND ELECTRIC CIRCUIT ASSEMBLY WITH THE SAME

(75) Inventors: Seung Wook Park, Gyeonggi-do (KR); Young Do Kweon, Seoul (KR); Mi Jin Park, Gyeonggi-do (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 40 days.

(21) Appl. No.: 12/897,842

(22) Filed: Oct. 5, 2010

(65) Prior Publication Data
US 2011/0309501 A1 Dec. 22, 2011

(30) Foreign Application Priority Data
Jun. 21, 2010 (KR) ........................ 10-2010-0058608

(51) Int. Cl.
*H01L 23/34* (2006.01)

(52) U.S. Cl.
USPC ....... 257/724; 257/738; 257/773; 257/E23.01

(58) Field of Classification Search
USPC .................................. 257/678–796, E23.01
See application file for complete search history.

(56) References Cited

U.S. PATENT DOCUMENTS

| 5,893,724 A | 4/1999 | Chakravorty et al. |
| 7,505,276 B2 | 3/2009 | Dangelmaier |
| 2001/0001216 A1* | 5/2001 | LaFontaine et al. ........... 257/738 |
| 2003/0030542 A1* | 2/2003 | von Hoffmann ............. 340/5.61 |
| 2004/0238857 A1* | 12/2004 | Beroz et al. .................... 257/232 |
| 2006/0255458 A1* | 11/2006 | Dangelmaier ................. 257/735 |

FOREIGN PATENT DOCUMENTS

| CN | 1674281 A | 9/2005 |
| JP | 2008166327 | 7/2008 |
| KR | 100234141 | 12/1999 |
| KR | 1020090090717 | 8/2009 |

OTHER PUBLICATIONS

Notification of the First Office Action dated Jun. 27, 2013 issued in Chinese Application No. 201010534591.2.

* cited by examiner

*Primary Examiner* — Tucker Wright
(74) *Attorney, Agent, or Firm* — Lowe, Hauptman & Ham

(57) ABSTRACT

Disclosed herein is a semiconductor package module. The semiconductor package module includes a circuit substrate having an external connection pattern; electronic components mounted on the circuit substrate; a molding structure having a structure surrounding the circuit substrate so as to seal the electronic components from the external environment; and an external connection structure of which one portion is connected to the external connection pattern and the other portion is exposed to the outside of the molding structure.

8 Claims, 3 Drawing Sheets

103

200

SEMICONDUCTOR PACKAGE MODULE AND ELECTRIC CIRCUIT ASSEMBLY WITH THE SAME

CROSS REFERENCE TO RELATED APPLICATION

This application claims the benefit of Korean Patent Application No. 10-2010-0058608, filed on Jun. 21, 2010, entitled "Semiconductor Package Module And Electric Circuit Assembly With The Same", which is hereby incorporated by reference in its entirety into this application.

BACKGROUND OF THE INVENTION

1. Technical Field

The present invention relates to a semiconductor package module and an electric circuit assembly with the same, and more particularly, to a semiconductor package module improving assembling and integration and an electric circuit assembly with the same.

2. Description of the Related Art

In general, a semiconductor package module provided in a portable mobile device such as a cellular phone is connected to a mother board, which is an RF system, using a flexible printed circuit board (FPCB). An electric circuit assembly configured of the semiconductor package module and the mother board connected to each other by the flexible printed circuit board as described above is mounted on a portable mobile device, thereby providing an electronic control system.

However, the electric circuit assembly according to the related art has a structure in which digital components and RF components of a portable mobile device are connected by a flexible printed circuit board, thereby being likely to cause problems of a complicated structure, heating, noise, and the like. In addition, in the electric circuit assembly according to the related art, the RF components and the digital components are connected to each other using the printed circuit board as described above, thereby having problems in that assembling of the products is low, electrical connection reliability between the components is weak, and there is a limitation in improving integration.

SUMMARY OF THE INVENTION

An object of the present invention is to provide a semiconductor package module improving assembling and having a simple structure and an electric circuit assembly with the same.

Another object of the present invention is to provide a semiconductor package module improving integration and an electric circuit assembly with the same.

Another object of the present invention is to provide a semiconductor package module having a structure to reduce heating and generation of noise and an electric circuit assembly with the same.

According to an exemplary embodiment of the present invention, there is provided a semiconductor package module, including: a circuit substrate having an external connection pattern; electronic components mounted on the circuit substrate; a molding structure having a structure surrounding the circuit substrate so as to seal the electronic components from the external environment; and an external connection structure of which one portion is connected to the external connection pattern and the other portion is exposed to the outside of the molding structure.

The molding structure may include: a first molding layer covering a front surface of the circuit substrate on which electronic components are mounted and selectively exposing the external connection structure; a second molding layer covering a rear surface of the circuit substrate opposite to the front surface; and a third molding layer covering a side surface of the circuit substrate so as to connect the first molding layer and the second molding layer.

The external connection structure may include a solder ball of which one portion is bonded to the external connection pattern and the other portion is exposed to the outside of the molding structure.

The external connection structure may include: a first solder ball of which one portion is bonded to the external connection pattern; and a second solder ball stacked on the first solder ball and having one portion exposed to the outside of the molding structure.

The external connection structure may include: a solder ball of which one portion is bonded to the external connection pattern and the other portion is exposed to the outside of the molding structure; and an external connection pattern bonded to the other portion of the solder ball.

According to an exemplary embodiment of the present invention, there is provided an electric circuit assembly including a semiconductor package module and an RF module that share one substrate, wherein the semiconductor package module includes: a circuit substrate having an external connection pattern; electronic components mounted on the circuit substrate; a molding structure having a structure surrounding the circuit substrate so as to seal the electronic components from the external environment; and an external connection structure of which one portion is connected to the external connection pattern and the other portion is exposed to the outside of the molding structure.

The substrate may include at least one cavity into which the semiconductor package module is inserted and the semiconductor package module may be detachably provided in the cavity.

The cavity may include a through hole penetrating through the substrate, and the through hole may have a shape corresponding to the semiconductor package module.

The substrate may further include a connection pad electrically connected to the external connection structure.

The molding structure may include: a first molding layer covering a front surface of the circuit substrate on which the electronic components are mounted; a second molding layer covering a rear surface of the circuit substrate opposite to the front surface; and a third molding layer covering a side surface of the circuit substrate so as to connect the first molding layer and the second molding layer.

The external connection structure may include a solder ball of which one portion is bonded to the external connection pattern and the other portion is exposed to the outside of the molding structure.

The external connection structure may include: a first solder ball of which one portion is bonded to the external connection pattern; and a second solder ball stacked on the first solder ball and having one portion exposed to the outside of the molding structure.

The external connection structure may include: a solder ball of which one portion is bonded to the external connection pattern and the other portion is exposed to the outside of the molding structure; and an external connection pattern bonded to the other portion of the solder ball.

According to an exemplary embodiment of the present invention, there is provided an electric circuit assembly including a semiconductor package module and an RF module that are electrically connected to each other, wherein the semiconductor package module includes: a circuit substrate having an external connection pattern; electronic components mounted on the circuit substrate; a molding structure having a structure surrounding the circuit substrate so as to seal the electronic components from the external environment; and an external connection structure of which one portion is connected to the external connection pattern and the other portion is exposed to the outside of the molding structure.

The semiconductor package module and the RF module may share one substrate, and the substrate may include a socket part in which at least one of the semiconductor package module and the RF module is fitted.

The socket part may include at least one cavity that corresponds to a shape of any one of the semiconductor package module and the RF module.

The semiconductor package module or the RF module may be inserted or separated into or from the socket part in a socket scheme.

The substrate may be disposed adjacent to the socket part to further include a connection pad electrically connected to the external connection structure.

The molding structure may include: a first molding layer covering a front surface of the circuit substrate on which the electronic components are mounted; a second molding layer covering a rear surface of the circuit substrate opposite to the front surface; and a third molding layer covering a side surface of the circuit substrate so as to connect the first molding layer and the second molding layer.

DESCRIPTION OF THE PREFERRED EMBODIMENTS

Figure 1:
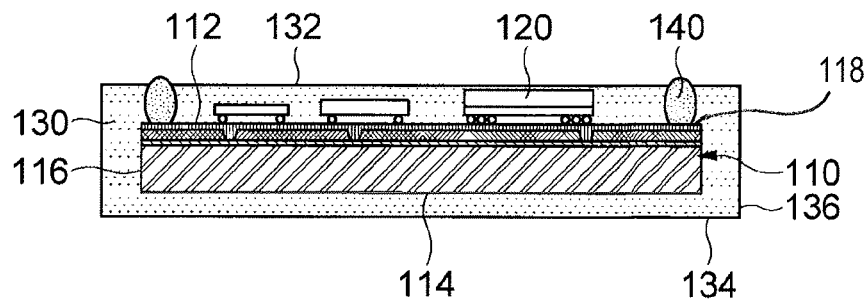
FIG. 1 is a diagram showing a semiconductor package module according to an embodiment of the present invention.

Various advantages and features of the present invention and methods accomplishing thereof will become apparent from the following description of embodiments with reference to the accompanying drawings. However, the present invention may be modified in many different forms and it should not be limited to the embodiments set forth herein. Rather, these embodiments may be provided so that this disclosure will be thorough and complete, and will fully convey the scope of the invention to those skilled in the art. Like reference numerals in the drawings denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Hereinafter, a semiconductor package module and an electric circuit assembly with the same according to exemplary embodiments of the present invention will be described in detail with reference to the accompanying drawings.

FIG. 1 is a diagram showing a semiconductor package module according to an embodiment of the present invention. Referring to FIG. 1, a semiconductor package module 100 according to an embodiment of the present invention may be configured to include a substrate 110, an electronic component 120, a molding structure 130, and an external connection structure 140.

The substrate 110 may be a circuit substrate on which predetermined electric wirings are formed. As an example, the substrate 110 may be any one of various kinds of printed circuit boards. The substrate 110 may includes a front surface 112, a rear surface 114 opposite to the front surface 112, and a side surface 116 connecting the front surface 112 and the rear surface 114. The front surface 112 may be a surface on which the electronic component 120 is mounted. An external connection pattern 118 that connects the electronic component 120 to an external electronic apparatus (not shown) may be formed on the front surface 112.

The electronic component 120 may be mounted on the substrate 110. The electronic component 120 may include a semiconductor package and other various kinds of chip components. For example, the electronic component 120 may be any one of various kinds of wafer level packages (WLP). The wafer level packages may be mounted on the front surface 112 of the substrate 110 by interposing a connection unit such as a solder bump.

The molding structure 130 may have a structure to cover the substrate 110 so as to protect the electronic component 120 from the external environment. For example, the molding structure 130 may be configured to include a first molding layer 132, a second molding layer 134, and a third molding layer 136. The first molding layer 132 may have a structure to cover the front surface 112 of the substrate 110 so as to seal the electronic component 120 from the external environment. The second molding layer 134 may have a structure to cover the rear surface 114, and the third molding layer 136 may have a structure to cover the side surface 116 so as to connect the first molding layer 132 and the second molding layer 134. The first to third molding layers 132, 134, and 136 may form a hexahedral structure surrounding the substrate 110, while covering the electronic component 120. Meanwhile, the molding structure 130 may have a structure capable of easily assembling the semiconductor package module 100 on an external electronic apparatus (not shown), and a detailed description thereof will be described below.

The external connection structure 140 may be a configuration for transferring electric signals between the external electronic apparatus and the electronic component 120. For example, the external connection structure 140 may include a solder ball bonded to the external connection pattern 118 of the substrate 110. The solder ball of the external connection structure 140 may include one portion bonded to the external connection pattern 118 and the other portion exposed to the outside of the molding structure 130.

Continuously, various modified examples of the semiconductor package module 100 described with reference to FIG. 1 will be described in detail. Herein, a description overlapping with the semiconductor package module 100 described above may be omitted or simplified.

Figure 2:
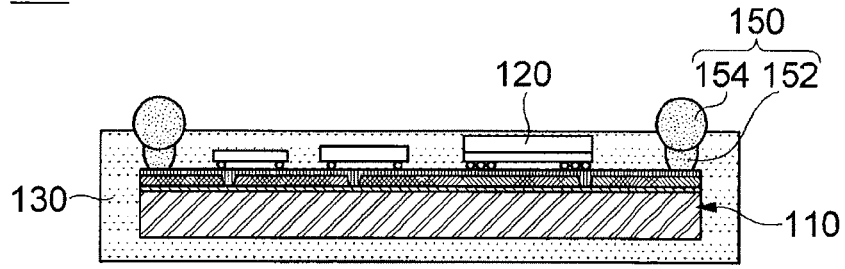
FIG. 2 is a diagram showing a modified example of a semiconductor package module according to an embodiment of the present invention.

FIG. 2 is a diagram showing a modified example of a semiconductor package module according to an embodiment of the present invention. Referring to FIG. 2, a semiconductor package module 101 according to a modified example of the present invention may be configured to include a substrate 110, an electronic component 120, a molding structure 130, and an external connection structure 150 having a solder stacked structure. The external connection structure 150 may include a first solder ball 152 and a second solder ball 154. A portion of the first solder ball 152 may be bonded to an external connection pattern 118 of the substrate 110. One portion of the second solder ball 154 may be bonded to the first solder ball 152 and the other portion of the second solder ball 154 may be exposed to the outside of the molding structure 130. Therefore, the first solder ball 152 and the second solder ball 154 may have a structure in which they are vertically stacked to be bonded to each other in the molding structure 130.

Figure 3:
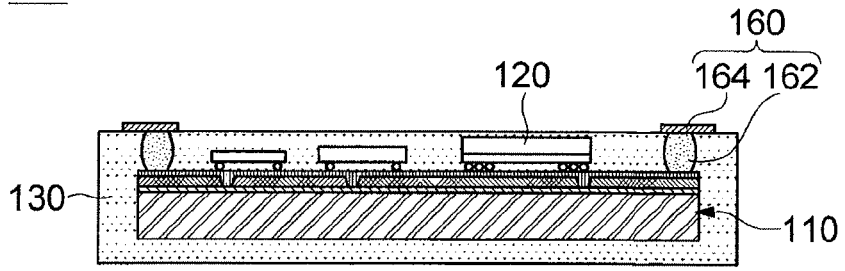
FIG. 3 is a diagram showing another modified example of a semiconductor package module according to an embodiment of the present invention.

FIG. 3 is a diagram showing another modified example of a semiconductor package module according to an embodiment of the present invention. Referring to FIG. 3, a semiconductor package module 102 according to another modified example of the present invention may be configured to include a substrate 110, an electronic component 120, a molding structure 130, and an external connection structure 160 having a bonding structure of a solder ball and a metal pad. The external connection structure 160 may include a solder ball 162 and an external connection pad 164 connected to the solder ball 162. One portion of the solder ball 162 may be bonded to the external connection pattern 118 of the substrate 110 and the other portion of the solder ball 162 may be exposed to the outside of the molding structure 130. The other exposed portion of the solder ball 162 may be positioned on the same plane as the outer surface of the molding structure 130. In other words, the other exposed portion of the solder ball 162 may have the plane that is co-planar with a surface of the molding structure 130. The external connection pad 164 may be formed on the molding structure 130 so as to be bonded to the solder ball 162.

Figure 4:
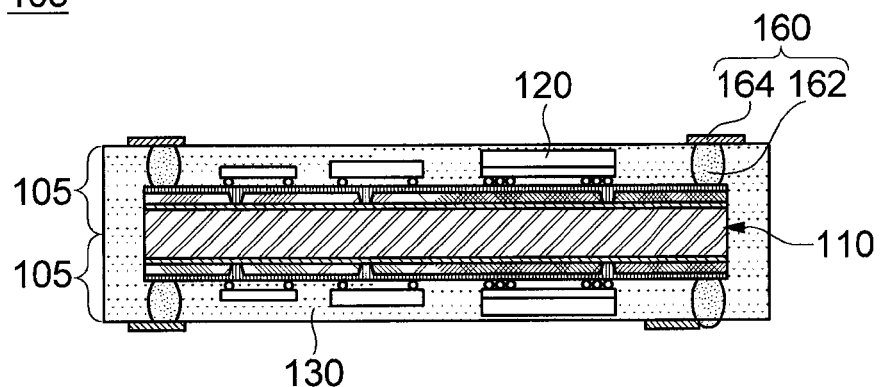
FIG. 4 is a diagram showing still another modified example of a semiconductor package module according to an embodiment of the present invention.

FIG. 4 is a diagram showing still another modified example of a semiconductor package module according to an embodiment of the present invention. Referring to FIG. 4, a semiconductor package substrate 103 according to still another embodiment of the present invention may include a substrate 110, and package structures each 105 having a vertically symmetrical structure based on the substrate 110. The package structure 105 may be configured to include an electronic component 120, a molding structure 130, and an external connection structure 160. The package structure 105 has a structure including the electronic component 120, the molding structure 130, and the external connection structure 160 described with reference to FIG. 1. The package structures 105 each may be configured to have a mirror structure based on the substrate 110.

Hereinafter, an electric circuit assembly according to the present invention will be described in detail. Herein, a description overlapping with the semiconductor package modules 100, 101, 102, and 103 described above may be omitted or simplified.

Figure 5:
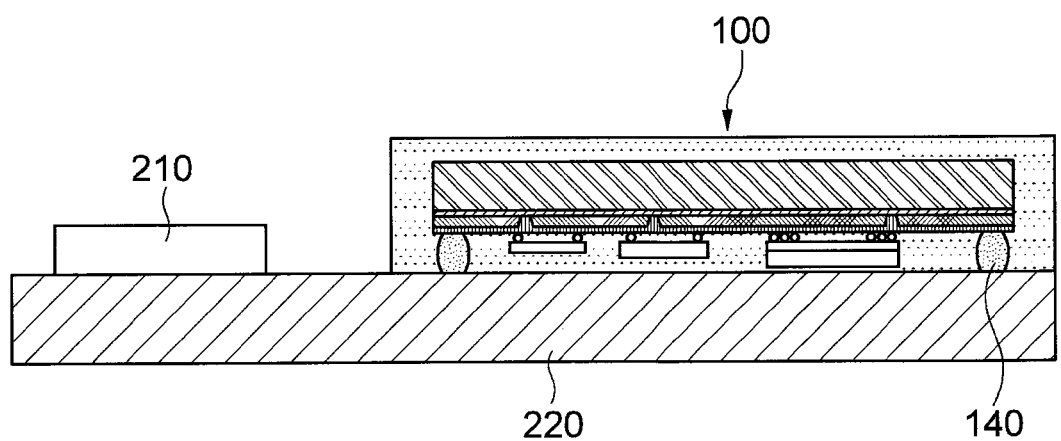
FIG. 5 is a diagram showing an electric circuit assembly according to an embodiment of the present invention.

FIG. 5 is a diagram showing an electric circuit assembly according to an embodiment of the present invention. Referring to FIG. 5, an electric circuit assembly 200 may have a structure in which the semiconductor package module 100 described with reference to FIG. 1 is combined with a RF module 210. The semiconductor package module 100 and the RF module 210 may be mounted on the same substrate 220.

Therefore, the semiconductor package module 100 and the RF module 210 may be configured to share the substrate 220.

Meanwhile, the semiconductor package module 100 may be surface-mounted on the substrate 220 by interposing an external connection structure 140 of the semiconductor package module 100. For example, the electric circuit assembly 200 may be manufactured by bonding the external connection structure 140 of the semiconductor package module 100 to the substrate 220. Therefore, the electric circuit assembly 200 having the structure as described above may be completely manufactured by simply bonding the external connection structure 140 of the semiconductor package module 100 to the substrate 220. Therefore, the electric circuit assembly 200 having the structure as described above can improve assembling and manufacturing efficiency as compared to a structure in which the semiconductor package module 100 and the RF module 210 are connected by using a separate printed circuit board and a connector.

The present embodiment describes the case in which the electric circuit assembly 200 is provided with the semiconductor package module 100 described with reference to FIG. 1 by way of example, but the semiconductor package module 100 provided with the electric circuit assembly 200 may be at least any one selected from the semiconductor package modules 100, 101, 102, and 103 described with reference to FIGS. 1 to 4, and the bonding structure, the disposition, or the like between the semiconductor package modules 100, 101, 102, and 103 and the substrate 220 may be variously changed.

Figure 6:
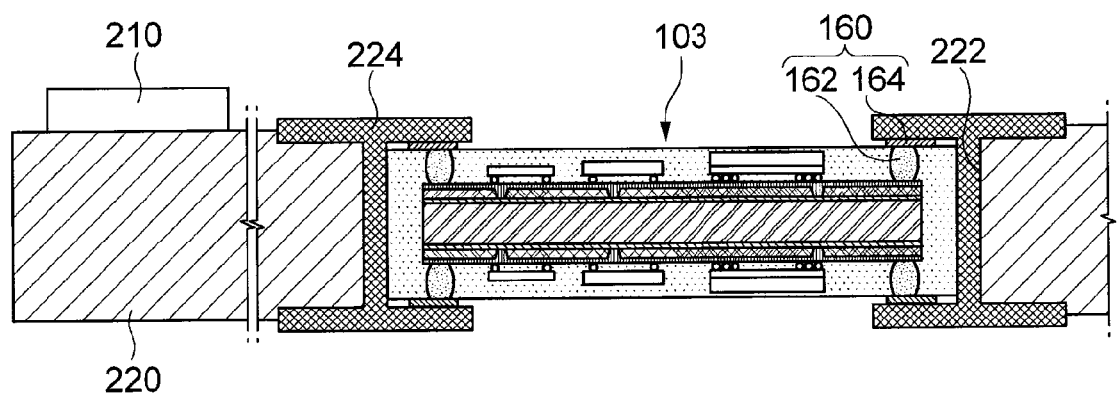
FIG. 6 is a diagram showing an electric circuit assembly according to another embodiment of the present invention.

FIG. 6 is a diagram showing an electric circuit assembly according to another embodiment of the present invention. Referring to FIG. 6, an electric circuit assembly 300 may have a structure in which the semiconductor package module 103 described with reference to FIG. 4 is combined with a RF module 210. The semiconductor package module 103 and the RF module 210 may be mounted on the same substrate 220. Therefore, the semiconductor package module 103 and the RF module 210 may be configured to share the substrate 220.

Meanwhile, the semiconductor package module 103 may be configured to be detachable from the substrate 220. To this end, the substrate 220 may include a cavity 222 in which the semiconductor package module 103 is fitted. To this end, the cavity 222 may have a different shape from the semiconductor package module 103. The cavity 222 may be a through hole penetrating through the substrate 220. When the cavity 222 is a through hole, if the semiconductor package module 103 is fitted in the substrate 220, both surfaces of the semiconductor package module 103 may be exposed to the outside. Alternatively, the cavity 222 may be a trench formed at a predetermined depth of the substrate 220. When the cavity 222 is a trench, the semiconductor package module 103 may be inserted only up to a predetermined depth of the substrate 220.

When the semiconductor package module 103 is fitted in the cavity 222, a circuit pattern 224 that is electrically connected to the external connection structure 160 of the semiconductor package module 103 may be provided in a region of the substrate 220, the region being adjacent to the cavity 222.

The cavity 222 having the structure as described above may provide a socket part that the semiconductor package module 103 is fitted in the substrate 220 in a socket scheme. The socket part may be configured of various shapes of cavity such as the through hole, the trench, or the like as described above. In this case, the present embodiment describes the case in which the semiconductor package module 103 is inserted into the cavity 222 in a socket scheme by way of example, the present invention may not be limited thereto. As another example, the present invention may also be configured such that the RF module 210 is inserted into the cavity 222 in a socket scheme.

The electric circuit assembly 300 is configured such that the semiconductor package module 103 is detachable to the substrate 220. Therefore, the semiconductor package module 103 is fitted in the cavity 222 of the substrate 220, thereby making it possible to complete the electric circuit assembly 300. Therefore, the electric circuit assembly 300 having the structure as described above has a structure to complete the manufacturing thereof by simply assembling the semiconductor package module 103 on the substrate 220, thereby making it possible to improve assembling and manufacturing efficiency.

The present embodiment describes the case in which the semiconductor package module 103 described with reference to FIG. 4 is provided by way of example, but the semiconductor package module 103 provided in the electric circuit assembly 300 may be at least one selected from the semiconductor package modules 100, 101, 102, and 103 described with reference to FIGS. 1 to 4. The bonding structure, the disposition, or the like of the semiconductor package modules 100, 101, 102, and 103 may be variously changed.

Meanwhile, the electric circuit assemblies 200 and 300 described above may be provided in various kinds of electronic apparatuses. For example, the electric circuit assemblies 200 and 300 may be provided in an electronic apparatus electrically operated by the electronic component 120. For example, the electric circuit assemblies 200 and 300 may be provided in various kinds of electronic apparatuses such as a mobile apparatus, a personal computer, an industrial computer, a logic apparatus performing various functions, or the like. Herein, the mobile apparatus may be any one of a personal digital assistant (PDA), a portable computer, a web tablet, a mobile phone, a wireless phone, a laptop computer, a memory card, a digital music system, and an information transmitting/receiving system.

The semiconductor package module according to the present invention can be configured to be easily provided on the substrate for connection with the RF module, such that the semiconductor package module can be easily electrically connected to the RF module. Therefore, the semiconductor package module according to the present invention is connected to the RF module, thereby making it possible to improve assembling with the substrate for forming the electric circuit assembly.

The electric circuit assembly according to the present invention includes the semiconductor package module and the RF module provided in different regions, thereby making it possible to have a structure in which the semiconductor package module and the RF module share one substrate. Accordingly, the electric circuit assembly according to the present invention does not include a separate flexible printed circuit board, connector, or the like, for connecting the semiconductor package module and the RF module, thereby making it possible to decrease problems of the electric circuit assembly, such as heating, noise, or the like, while having a simple structure.

The electric circuit assembly according to the present invention includes the semiconductor package module and the RF module provided in different regions, and the semiconductor package module can be detachably provided on the substrate. At this time, the semiconductor package module may be configured to be inserted into the substrate. Therefore, the electric circuit assembly according to the present invention can have a structure improving assembling and integration.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. An electric circuit assembly, comprising:
    a substrate having a cavity; and
    a semiconductor package module fitted in a detachable manner into the cavity of the substrate in a socket scheme, wherein
    the semiconductor package module includes:
        a circuit substrate having an external connection pattern, a front surface, a rear surface opposite to the front surface, and a side surface connecting the front surface and the rear surface;
        at least one electronic component mounted on the front surface of the circuit substrate;
        a molding structure surrounding the circuit substrate so as to seal the at least one electronic component from an external environment; and
        an external connection structure having a first portion connected to the external connection pattern and a second portion protruded from the molding structure to outside,
    the molding structure includes:
        a first molding layer covering the front surface of the circuit substrate and the at least one electronic component, while exposing the second portion of the external connection structure;
        a second molding layer covering the rear surface of the circuit substrate; and
        a third molding layer covering the side surface of the circuit substrate and connecting the first molding layer and the second molding layer, and
    the second molding layer extends continuously without being interrupted by the external connection structure.

2. The electric circuit assembly according to claim 1, wherein the substrate further includes a connection pad electrically connected to the external connection structure.

3. The electric circuit assembly according to claim 1, wherein the external connection structure includes a solder ball of which one portion is bonded to the external connection pattern and the other portion is exposed to the outside of the molding structure.

4. The electric circuit assembly according to claim 1, wherein the external connection structure includes:
    a first solder ball of which one portion is bonded to the external connection pattern; and
    a second solder ball stacked on the first solder ball and having one portion exposed to the outside of the molding structure.

5. The electric circuit assembly according to claim 1, wherein the external connection structure includes:
   a solder ball of which one portion is bonded to the external connection pattern and the other portion is exposed to the outside of the molding structure; and
   an external connection pattern bonded to the other portion of the solder ball.

6. An electric circuit assembly, comprising:
   a substrate having a through hole penetrating through the substrate;
   a semiconductor package module fitted in a detachable manner into the through hole of the substrate in a socket scheme and having opposite surfaces exposed from the substrate; and
   a radio frequency (RF) module electrically connected to the semiconductor package module, wherein
   the semiconductor package module includes:
      a circuit substrate having an external connection pattern, a front surface, a rear surface opposite to the front surface, and a side surface connecting the front surface and the rear surface;
      at least two electronic components mounted on the front surface and the rear surface of the circuit substrate;
      a molding structure surrounding the circuit substrate and the at least two electronic components so as to seal the at least two electronic components from an external environment; and
      at least two external connection structures having first portions connected to the external connection pattern and second portions protruded to outside from the molding structure covering the front and rear surfaces of the circuit substrate.

7. The electric circuit assembly according to claim 6, wherein the substrate further includes connection pads disposed adjacent to the through hole and electrically connected to the at least two external connection structures.

8. An electric circuit assembly, comprising:
   a substrate having a through hole penetrating through the substrate;
   a semiconductor package module detachably fitted into the through hole of the substrate and having opposite surfaces exposed from the substrate; and
   a radio frequency (RF) module electrically connected to the semiconductor package module, wherein
   the semiconductor package module includes:
      a circuit substrate having an external connection pattern, a front surface, a rear surface opposite to the front surface, and a side surface connecting the front surface and the rear surface;
      at least two electronic components mounted on the front surface and the rear surface of the circuit substrate;
      a molding structure surrounding the circuit substrate and the at least two electronic components so as to seal the at least two electronic components from an external environment; and
      at least two external connection structures having first portions connected to the external connection pattern and second portions exposed from the molding structure covering the front and rear surfaces of the circuit substrate, wherein
   the substrate further includes connection pads disposed adjacent to the through hole and electrically connected to the at least two external connection structures.

* * * * *